United States Patent [19]

Dmitriev et al.

[11] Patent Number: 5,766,343
[45] Date of Patent: Jun. 16, 1998

[54] LOWER BANDGAP, LOWER RESISTIVITY, SILICON CARBIDE HETEROEPITAXIAL MATERIAL, AND METHOD OF MAKING SAME

[75] Inventors: Vladamir A. Dmitriev, Fuquay; Kenneth G. Irvine, Apex, both of N.C.; Michael Spencer, Washington, D.C.; Galina Kelner, Potomac, Md.

[73] Assignee: The United States of America as represented by the Secretary of the Navy, Washington, D.C.

[21] Appl. No.: 374,473

[22] Filed: Jan. 17, 1995

[51] Int. Cl.$^6$ .................................................. C30B 29/36
[52] U.S. Cl. .................................................. 117/88; 117/951
[58] Field of Search ........................................ 117/88, 951

[56] References Cited

U.S. PATENT DOCUMENTS

| | | | |
|---|---|---|---|
| 5,200,022 | 4/1993 | Kong et al. | 117/95 |
| 5,248,385 | 9/1993 | Powell | 117/97 |
| 5,270,554 | 12/1993 | Palmour | 257/77 |
| 5,326,992 | 7/1994 | Yoder | 257/77 |
| 5,363,800 | 11/1994 | Larkin et al. | 117/95 |

OTHER PUBLICATIONS

V. Dmitriev et al., "Growth of SiC and SiC–AlN solid solution by container–free liquid phase epitaxy," Journal of Crystal Growth, vol. 128, No. 1–4, pp. 343–348, Mar. 1993 (abstract only).

K.J. Irvine et al., "Heteropolytype growth of beta silicon carbide on alpha silicon carbide by low pressure chemical vapor deposition at 1150 °C," Semi. Heterstructures for Photonic & Electronic App. Symp., Mater. Res. Soc., pp. 793–796, 1993.

A.J. Learn et al., "Low–Temperature Epitaxy of β–SiC by Reactive Deposition," Applied Physics Letters, vol. 17, No. 1, 1 Jul. 1970, pp. 26–29.

V.A. Dmitriev et al., Low Resistivity ($\sim 10^{-5} \Omega cm^2$) Ohmic Contacts to 6H Silicon Carbide Fabricated using Cubic Silicon Carbide Contact Layer, *Applied Physics Letters*, vol. 64, No. 3 (Jan. 17, 1994), at p. 318.

Letter dated Dec. 29, 1994, from Pamela Karwowski of Canterbury Press, to Ed(ward) Miles of the Naval Research Laboratory.

*Primary Examiner*—Robert Kunemund
*Attorney, Agent, or Firm*—Thomas E. McDonnell; Edward F. Miles

[57] ABSTRACT

A silicon carbide semiconductor material; and method of making same, in which a doped film of 3C-silicon carbide is grown heteroepitaxially on a 6H-silicon carbide material. Growth occurs at 1200° C. or less, and produces a heterolayer having a reduced bandgap, and hence reduced contact resistance, but which is fabricatable with the less expensive equipment commonly used to fabricate silicon based semiconductors.

22 Claims, 1 Drawing Sheet

LOWER BANDGAP, LOWER RESISTIVITY, SILICON CARBIDE HETEROEPITAXIAL MATERIAL, AND METHOD OF MAKING SAME

BACKGROUND OF THE INVENTION

Silicon Carbide is a wide band-gap semiconductor which is attractive for fabrication of high temperature devices (e.g. diodes, field effect transistors, bipolar transistors, etc.), optoelectronic devices (green, blue, violet or violet light-emitting diodes, etc.) and high power microwave devices. While silicon carbide exists in over 170 polytypes, the most common are 3C-silicon carbide (cubic) and 6H-silicon carbide (hexagonal). Currently, most silicon carbide devices are fabricated from the 6H-silicon carbide polytype. Fabrication of 6H-silicon carbide devices is done at high temperature. On the other hand, most growth of silicon carbide structures for device fabrication is done at relatively low temperature, 1200° C. or less. For this reason, 6H-silicon carbide fabrication requires specialized machinery for crystal growth, and, for example, cannot use the less expensive and more readily available chemical vapor deposition apparatus used for silicon.

The performance of semiconductor devices made of 6H-silicon carbide is limited by high contact resistance. Numerical simulation of silicon carbide metal-semiconductor field effect transistors and IMPATT diodes shows that high power, high frequency devices require ohmic contacts with a resistivity of less than $10^{-5}$ $\Omega cm^2$. Currently, the best known values of specific contact resistance for 6H-silicon carbide are $2(10)^{-4}$ $\Omega cm^2$ for contacts to n-type silicon carbide, and $4(10)^{-4}$ $\Omega cm^2$ for p-type contacts. The lower contact resistances obtained with 3C-silicon carbide are probably related to the lower energy gap of this polytype relative to 6H-silicon carbide, and 3C-silicon carbide's lower effective carrier mass.

Heteroepitaxial composites of 3C-silicon carbide and 6H-silicon carbide are known, and it is generally known that one can grow virtually unlimited thicknesses of single crystal 3C polytype on a 6H polytype substrate at 1400° C. and above, and lesser thicknesses at lower temperatures. However, it has not been clear that one could fabricate sufficiently thick, doped, films of 3C-silicon carbide on a 6H-silicon carbide substrate below about 1200° C., which would permit fabrication of these heterolayers with the less expensive and simpler equipment commonly used in silicon fabrication.

SUMMARY OF THE INVENTION

Accordingly, an object of the invention is to significantly reduce contact resistance of silicon carbide semiconductors.

Another object is to do so by use of 3C-6H silicon carbide heteroepitaxial layers.

Another object is to permit fabrication and doping of such heteroepitaxial layers at temperatures of no more than 1200° C.

Another object is to do the foregoing in a manner which permits the 3C-silicon carbide film to be sufficiently thick to sustain attachment of effective ohmic contacts.

Another object is to do the foregoing with equipment and techniques typical for use with silicon device fabrication.

In accordance with these, and other objects made apparent hereinafter, the invention proceeds from the insight that, by analogy to gallium arsenide and silicon, heteroepitaxial films of different material poly types can be grown up to about 400° C. below the temperature at which growth is unlimited. For silicon carbide, this is about 1000° C., which is well below the 1200° C. at which one can use silicon equipment and techniques. Using such standard techniques, we have fabricated, and attached effective ohmic contacts to, a single crystal, n or p doped, 3C-silicon carbide film of up to $2(10^3)$Å on a 6H-silicon carbide substrate, at as low as 1150° C.

These and other objects are further understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

DETAILED DESCRIPTION

Figure 1:
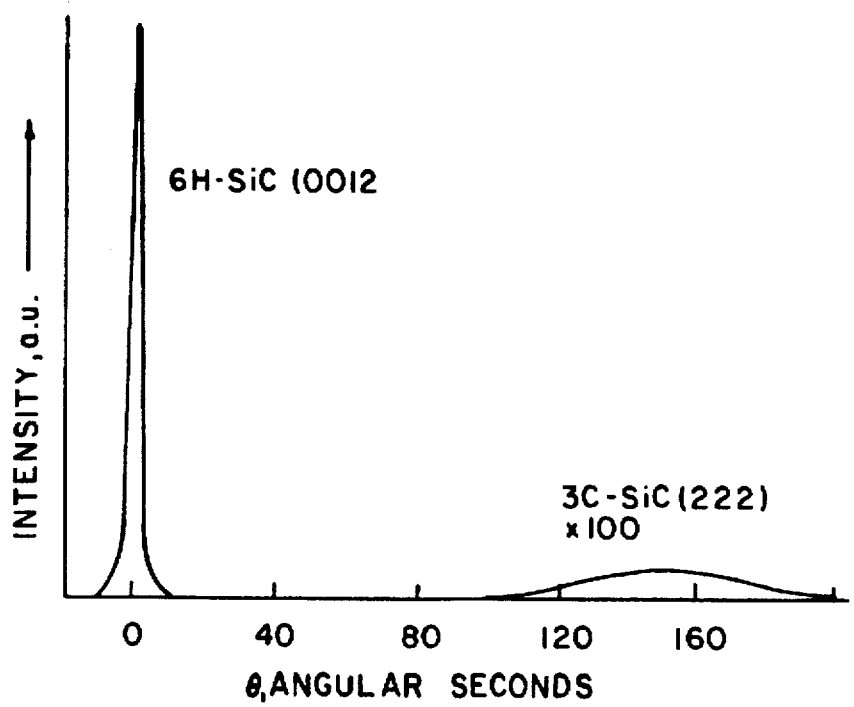
FIG. 1 is an x-ray diffraction rocking curve of samples fabricated according to the invention, showing the presence of both 3C and 6H-silicon carbide.

In accordance with the invention, a substrate of 6H-silicon carbide is provided initially. The crystal substrate is grown in any conventional manner, for example by the Lely method. It is etched, for example by molten potassium hydroxide, to remove crystal surface defects and expose silicon and carbon faces for use as deposition surfaces. The substrates must be singular single crystalline and on-axis: off axis substrates will strongly favor production of 6H, rather than 3C, silicon carbide. The substrate is placed in a reaction chamber, and heteroepitaxial growth commenced. This is done preferably by conventional chemical vapor deposition of silicon carbide, mixed with the desired dopant material. Dopant material or concentration is not critical, so long as the dopant meets the universal semiconductor criteria that it be chemically compatible with the host material, and that dopant level not exceed the dopant's solubility in the host material. However, the higher the dopant concentration, the lower the contact resistance. Nitrogen is conventional, and preferred as n-type dopant. Aluminum is preferred at p-type dopant, particularly because it facilitates especially good ohmic contacts, especially when capped with a titanium layer to prevent the aluminum from evaporating. Growth ceases prior to the thickness of the 3C-silicon carbide layer exceeding the critical thickness for a single crystal film. This critical thickness is temperature dependent. As discussed below, the critical thickness at about 1150° C. is about 2000 Å, which permits good ohmic contact. Because this thickness is mechanically effective, and is safely single crystal at higher temperatures, it is preferred.

EXAMPLE

Layers of 3C-silicon carbide were grown on 6H-silicon carbide<0001> on axis by low pressure chemical vapor deposition. The equipment and growth parameters are known, and described in K. G. Irvine et al., *Material Science Engineering*, vol. B 11, 93 (1992). To grow an epitaxial layer on the 6H-silicon carbide substrate, a $SiH_4$—$C_3H_8$—$H_2$ gas system was used. N-type layers were doped with nitrogen by introducing $NH_3$ (1% in $H_2$) gas into the reactor, and p-type layers were doped with aluminum by using trimethylaluminum. Growths were carried out at 76 Torr and the substrate temperature was 1150° C. The n-type 3C-silicon carbide were grown on n-type 6H-silicon carbide by chemical vapor deposition. The net carrier concentration of electrically active uncompensated donor impurities ($N_d$—$N_a$) in the substrates was approximately $1-2(10)^{18}$ cm$^{-3}$. Epitaxial p-type 3C-silicon carbide layers were grown on p-type 6H-silicon carbide layers previously deposited on the same Lely substrates by container-free liquid phase epitaxy. Before the deposition substrates ere etched in molten potassium hydroxide, depositions of 3C-silicon carbide were performed on both the <0001>silicon and <0001>carbon faces for n-type layers, and on the <0001>silicon faces for the p-type layers. The total growth thickness of the 3C-silicon carbide films was kept below $2(10)^3$ Å. The thickness of the 3C-silicon carbide layers was estimated by earlier calibrated growth rates, and was verified for a few samples by transmission electron microscopy.

The epitaxial layers had a smooth surface, and no growth relief was seen using optical microscopy at 1000× magnification. Electron channeling techniques were used to study the crystallinity of the 3C-silicon carbide films, which revealed a hexagonal channeling pattern. (A photograph of such a channeling pattern for one of the samples is shown in FIG. 1 of the paper by V. A. Dmitriev et al., Low Resistivity ($\sim 10^{-5}$ $\Omega$cm$^2$) Ohmic Contacts to 6H-Silicon Carbide Fabricated Using Cubic Silicon Carbide Contact Layer, *Applied Physics Letters*, 64 (3), dated Jan. 17, 1994, a copy of which is submitted with this application.) The shape of the channeling pattern can be due to either <0001> 6H-silicon carbide or <111> 3C-silicon carbide. In order to distinguish between the polytypes, an x-ray diffraction study on some of the samples was performed, and the results presented in. The tall curve centered at "0" represents x-ray intensity at the angle one would expect from 6H-silicon carbide. The flatter curve is displaced from "0" by an angular distance which one would expect for the diffraction curve of 3C-silicon carbide to be displaced from the curve for 6H-silicon carbide. This indicates that the epilayers are of cubic polytype. The relative height of the curves in FIG. 1 confirms that the sample contains much more 6H-silicon carbide than 3C type.

The carrier concentration of the 3C-silicon carbide films was estimated using Hall measurements performed on specially grown 3C-silicon carbide films on 6H-silicon carbide substrates with the opposite type conductivity. It was found to be on the order of $1-3(10)^{19}$ cm$^{-3}$. The films of 3C-silicon carbide on 6H-silicon carbide were grown using the same growth conditions, but on the substrate with the same type conductivity. From this it is believed that crystalline layers of 3C-silicon carbide highly doped with nitrogen were grown on the 6H-silicon carbide substrates at 1150° C.

Figure 2:
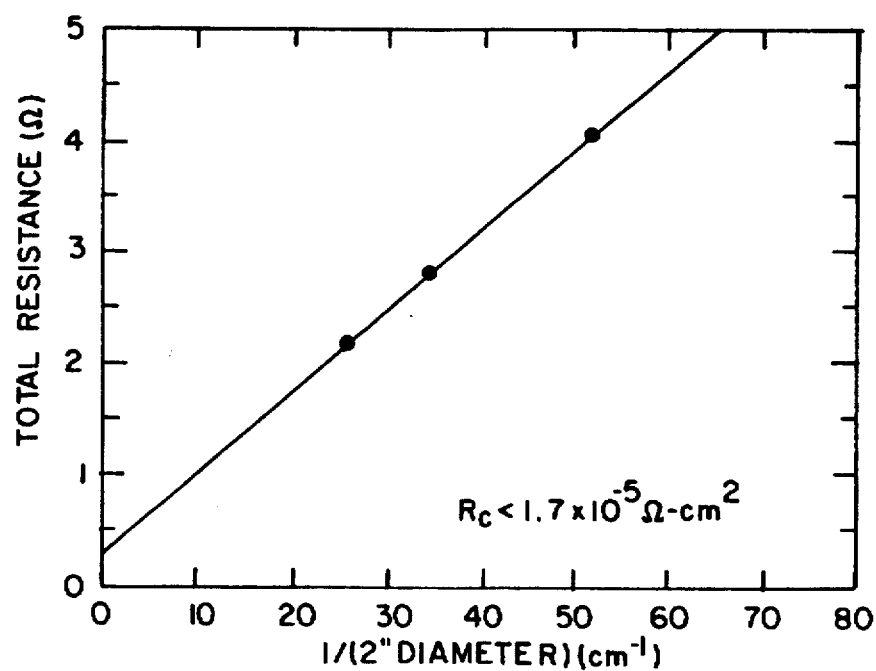
FIG. 2 is a plot of total resistance versus contact diameter, to determine the resistivity of a sample fabricated according to the invention.

Metallization of the 3C-silicon carbide heteroepitaxial films was accomplished by resistive evaporation of 1000 Å of nickel for n-type contacts and by e-beam evaporation of 1500 Å of aluminum followed by 150 Å of titanium for the p-type contacts. The n-type contacts were ohmic as deposited; on the other hand, the p-type contacts were not contacts were annealed using a rapid thermal anneal at 1000° C. for 30 seconds for the n-type contact, and at 950° C. for 2 minutes for the p-type contact. The specific contact resistance of ohmic contacts to the n-type and p-type 6H-silicon carbide with a thin cap of 3C-silicon carbide polytype were then measured. The values of the n-type ohmic contacts were estimated by using a two terminal resistor structure introduced by Cox and Strack (see, *Solid-State Electronics*, 10, 1213 (1967)), while the p-type resistivity was measured by a transmission line method. To implement the Cox and Strack method, an array of metal dots of diameters varying from 70 to 200 microns was fabricated on the 3C-silicon carbide cap layer, and the back side of the 6H-silicon carbide was fully metallized. Due to the difference in the front and back contact size, the current density varied across the contact area. The total resistance as a function of the front side diameter was measured using four-point probe measurements on a Hewlett-Packard 4145B semiconductor parameter analyzer, and then the values of contact resistance were extracted. FIG. 2 shows the results as a plot of the inverse contact diameter verses total resistance. The slope of the plot is the sample's resistivity, which was $1.7(10^{-5}$ $\Omega$cm$^2$.) Because contact density was not uniform through the wafer, this represents an upper limit of the sample's true resistivity. Similar measurements made on a sample with a 3C-silicon carbide film on a 6H-silicon carbide carbon face yielded a resistivity having an upper limit of $6 (10^{-5}$ $\Omega$cm$^2$).

An array of nickel metal dots was also deposited directly on 6H-silicon carbide with the 3C-silicon carbide film etched away, and the value of resistivity for the uncapped material was $2(10^{-4}$ $\Omega$cm$^2$). This value is almost 10 times higher than that for 3C-silicone carbide grown on the silicon face of 6H-silicon carbide.

Metallization of the p-type 3C-silicon carbide/6H-silicon carbide epitaxial films was accomplished by e-beam evaporation of 1500 Å of aluminum followed by 150 A of titanium. The p-type contacts became ohmic after the rapid thermal anneal in nitrogen at 950° C. for 120 seconds. Electrical isolation of the mesa for the transmission line methods was accomplished by the reactive ion etching with carbon tetrafluoride plus $O_2$. Three-thousand Å of aluminum was thermally evaporated as a mask. For aluminum/titanium contacts to the p-type 3C-silicon carbide structure, the contact resistance was found to be $2-3(10^{-5})$ $\Omega$cm$^2$.

The invention has been described in what is considered to be the most practical and preferred embodiments. It is recognized, however, that obvious modifications to these embodiments may occur to those with skill in this art. Accordingly, the scope of the invention is to be discerned from reference to the appended claims, wherein:

We claim:

1. A method of semiconductor fabrication, comprising the steps of:

providing a 6H-silicon carbide substrate;

exposing a surface of said substrate, said surface having a crystallographic orientation favorable to 3C-silicon carbide growth;

heating said substrate to no more than about 1200° C.;

growing an n- or p-doped single crystal 3C-silicon carbide heteroepitaxial film on said surface; and attaching ohmic contacts to said film.

2. The method of claim 1, wherein said growing causes said film to be n-doped, and said attaching of said ohmic contacts to said film is done by resistive evaporation of nickel.

3. The method of claim 2, wherein said resistive evaporation causes deposition of a nickel layer of $10^{30}$A.

4. The method of claim 3, wherein said attaching further comprises rapid thermal anneal at $10^{30}$C for at least about 30 seconds.

5. The method of claim 2, wherein said attaching further comprises rapid thermal anneal at 950° C. for 2 minutes.

6. The method of claim 3, wherein said step of growing causes said film to be no more than 2000 Å thick.

7. The method of claim 1, wherein said growing causes said film to be p-doped, and said attaching of said ohmic contacts to said film is done by electron beam evaporation of aluminum and titanium.

8. The method of claim 7, wherein said electron beam evaporation causes deposition of a layer on said film of 1500 Å of aluminum and 150 Å of titanium.

9. The method of claim 8, wherein said attaching further comprises rapid thermal anneal t 950° C. for 2 minutes.

10. The method of claim 7, wherein said attaching further comprises rapid thermal anneal at 950° C. for 2 minutes.

11. The method of claim 7, wherein said step of growing causes said film to be no more than 2000 Å thick.

12. The method of claim 1, wherein said step of growing causes said film to be no more than 2000 Å thick.

13. The method of claim 12, wherein said heating causes heating of said substrate to no more than 1150° C.

14. A method of semiconductor fabrication, comprising the steps of:

provinding a 6H-silicon carbide substrate;

exposing a surface of said substrate, said surface having a crystallographic orientation favorable to 3C-silicon carbide growth;

growing an n- or p-doped single crystal 3C-silicon carbide heteroepitaxial film on said surface; and attaching ohmic contacts to said film.

15. The method of claim 14, wherein said growing causes said film to be n-doped, and said attaching of said ohmic contacts to said film is done by resistive evaporation of nickel.

16. The method of claim 15, wherein said resistive evaporation causes deposition of a nickel layer of $10^3$ Å.

17. The method of claim 16, wherein said attaching further comprises rapid thermal anneal at $10^{30}$C for at least about 30 seconds.

18. The method of claim 15, wherein said attaching further comprises rapid thermal anneal at $10^{30}$C for at least about 30 seconds.

19. The method of claim 14, wherein said growing causes said film to be p-doped, and said attaching of said ohmic contacts to said film is done by electron beam evaporation of aluminum and titanium.

20. The method of claim 19, wherein said electron beam evaporation causes deposition of a layer on said film of 1500 Å of aluminum and 150 Å of titanium.

21. The method of claim 20, wherein said attaching further comprises rapid thermal anneal at 950° C. for 2 minutes.

22. The method of claim 19, wherein said attaching further comprises rapid thermal anneal at 950° C. for 2 minutes.

* * * * *